United States Patent
Park et al.

(10) Patent No.: US 9,029,273 B2
(45) Date of Patent: May 12, 2015

(54) METHOD FOR FORMING SILICON OXIDE FILM OF SEMICONDUCTOR DEVICE

(71) Applicant: SK Hynix Inc., Icheon-si (KR)

(72) Inventors: Hyung Soon Park, Icheon-si (KR); Kwon Hong, Seongnam-si (KR); Jong Min Lee, Suwon-si (KR); Hyung Hwan Kim, Icheon-si (KR); Ji Hye Han, Seoul (KR); Geun Su Lee, Yongin-si (KR)

(73) Assignees: SK Hynix Inc., Icheon (KR); Geun Su Lee, Yongin (KR)

( * ) Notice: Subject to any disclaimer, the term of this patent is extended or adjusted under 35 U.S.C. 154(b) by 131 days.

(21) Appl. No.: 13/840,551

(22) Filed: Mar. 15, 2013

(65) Prior Publication Data

US 2014/0057458 A1    Feb. 27, 2014

(30) Foreign Application Priority Data

Aug. 23, 2012   (KR) .................. 10-2012-0092458

(51) Int. Cl.
   *H01L 21/316*   (2006.01)
   *H01L 21/02*   (2006.01)

(52) U.S. Cl.
   CPC .... *H01L 21/02164* (2013.01); *H01L 21/02219* (2013.01); *H01L 21/02222* (2013.01); *H01L 21/02282* (2013.01); *H01L 21/02307* (2013.01); *H01L 21/02326* (2013.01); *H01L 21/02343* (2013.01)

(58) Field of Classification Search
   CPC ........... H01L 21/02164; H01L 21/314; H01L 21/02107; H01L 21/02225; H01L 21/0226; H01L 21/02282; H01L 21/02299; H01L 21/02307; H01L 21/02318; H01L 21/02343
   USPC ................................ 438/787, 790
   See application file for complete search history.

(56) References Cited

U.S. PATENT DOCUMENTS

| | | | | |
|---|---|---|---|---|
| 5,922,411 | A * | 7/1999 | Shimizu et al. | 427/397.7 |
| 6,319,852 | B1 * | 11/2001 | Smith et al. | 438/778 |
| 6,479,405 | B2 * | 11/2002 | Lee et al. | 438/782 |
| 7,517,817 | B2 * | 4/2009 | Goo et al. | 438/785 |
| 7,629,227 | B1 | 12/2009 | Wang et al. | |
| 7,943,531 | B2 | 5/2011 | Nemani et al. | |
| 2004/0018694 | A1 | 1/2004 | Lee et al. | |
| 2006/0160321 | A1* | 7/2006 | Ichiyama et al. | 438/424 |
| 2008/0061398 | A1* | 3/2008 | Nagura | 257/510 |
| 2008/0090988 | A1* | 4/2008 | Nakazawa et al. | 528/31 |
| 2009/0278223 | A1* | 11/2009 | Ishikawa et al. | 257/506 |

(Continued)

FOREIGN PATENT DOCUMENTS

| JP | 09183663 A | * | 7/1997 |
|---|---|---|---|
| JP | 2001-089126 A | | 4/2001 |

(Continued)

OTHER PUBLICATIONS

Chemical BooK website, Properties of Hydroxylamine, http://www.chemicalbook.com/ChemicalProductProperty_US_CB3345090.aspx (2007).*

*Primary Examiner* — Michele Fan

(57) ABSTRACT

A method for forming a silicon oxide film of a semiconductor device is disclosed. The method of forming the silicon oxide film of the semiconductor device includes performing surface processing using an amine-based compound, so that the uniformity and density of the silicon oxide film may be improved.

14 Claims, 3 Drawing Sheets

(56) References Cited

U.S. PATENT DOCUMENTS

2010/0009546 A1* 1/2010 Weigel et al. ............... 438/781
2010/0112749 A1* 5/2010 Park et al. .................. 438/99
2010/0164057 A1* 7/2010 Hunks et al. ............... 257/520
2010/0289143 A1* 11/2010 Cho et al. .................. 257/741

FOREIGN PATENT DOCUMENTS

| JP | 2001089126 A | * | 4/2001 |
| JP | 2012000599 A | * | 1/2012 |
| KR | 10-2004-0107354 A | | 12/2004 |
| KR | 10-2005-0045799 A | | 5/2005 |

* cited by examiner

--Prior Art--

METHOD FOR FORMING SILICON OXIDE FILM OF SEMICONDUCTOR DEVICE

CROSS-REFERENCE TO RELATED APPLICATION

The present application claims priority to Korean patent application No. 10-2012-0092458 filed on 23 Aug. 2012, which is incorporated by reference in its entirety.

BACKGROUND OF THE INVENTION

Embodiments of the present invention relate to a semiconductor device and a method for forming a silicon oxide film of a semiconductor device, and more particularly to a method for forming a semiconductor device by performing surface processing on a substrate using an amine-based compound to improve uniformity and density of a silicon oxide film provided over the semiconductor substrate.

In recent times, as information media, such as computers, has come into widespread use, technology for manufacturing semiconductor devices has rapidly developed. In a functional aspect, it is necessary for semiconductor devices to operate at a high speed and have a high storage capacity. Therefore, technology for manufacturing semiconductor devices has focused on improving integration, reliability, response time, etc.

In a conventional semiconductor device, a first metal line is formed over a semiconductor substrate, and an insulation film is formed to fill gaps between first metal lines. A via hole connected to the first metal line is formed in the insulation film, and a second metal line connected to the via hole is formed over the insulation film. The above-mentioned processes are repeated several times in the manufacturing of the semiconductor device. A borophosphosilicate glass (BPSG) with a superior gap-filling capability or a spin on dielectric (SOD) is deposited over the entire surface of the semiconductor substrate including the first metal line. The BPSG or SOD film is then annealed to form an insulation film.

However, since the semiconductor device includes μm-sized trenches, metal lines, via holes, etc., and is manufactured according to the Moore's Law, it becomes more difficult to form an even insulation film. In particular, when the BPSG or SOD film is formed at a temperature of 700° C. or less to reduce short channel effects, the BPSG film may be unevenly formed, and the SOD film may further affect package reliability.

In order to reduce the above-mentioned effects, silicon oxide film precursors have recently been proposed as an insulation material having improved gap-filling capabilities. For example, the silicon oxide film precursors may comprise i) polysilazane, which serves as an amine-based oxide precursor, and ii) trisilylamine (TSA), which serves as a flowable oxide (FO) precursor.

When the polysilazane is used as a silicon oxide film precursor, a polysilazane precursor is coated over a substrate. The coated substrate is then annealed at a temperature of 100-500° C., so that a silicon oxide film is formed, as indicated by the following reaction 1.

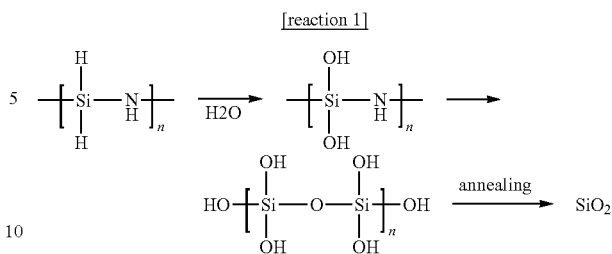

[reaction 1]

When the TSA is used as a silicon oxide film precursor, a TSA precursor is deposited over the substrate at a high temperature. After the deposition, hydrolysis between the TSA precursor and distilled water (H$_2$O) occurs so that a silicon oxide film is formed, as indicated by the following reaction 2.

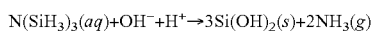

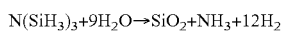      [reaction 2]

However, as the size of a semiconductor device is reduced to 30 nm or less, when polysilazane precursor is used, it becomes more difficult to fill the gaps uniformly, and a void is formed in the silicon oxide film. In addition, bubbles (H$_2$, NH$_3$, N$_2$, H$_2$O) may be generated in the annealing process, such that the surface of the silicon oxide film becomes uneven, or a crack or the like occurs in the silicon oxide film.

If a TSA precursor is used, elements N and H contained in the TSA precursor have low heat transfer rates. Accordingly, when a TSA film having a thickness of 1-10K Å is used to fill in a high-aspect-ratio trench or between metal lines, the generated NH$_3$ gas may not be sufficiently volatilized, or the Si—N bond may not be decomposed, even though the annealing process is performed at a high temperature of 100° C. or higher. As a result, a SiO$_2$ conversion rate is low, and a lower portion of a film does not change to an oxide film. Thus, defects, such as cracks, micro-pores, distribution, or delamination, etc. are generated in the silicon oxide film. Moreover, since a contact interface may be polluted by N and H outgassing, Rc resistance of a metal line or a via hole may be deteriorated. The unsubstituted NH groups accumulated at a sidewall of a gate further result in the formation of cracks.

In accordance with the above-mentioned conventional method, substitution of the silicon oxide precursor into the silicon oxide film (13) may not be complete, even though annealing is performed at a high temperature. Accordingly, the unsubstituted nitrogen (N) particles (i.e., white particles (15) shown in the Electron Energy Loss Spectrometer (EELS) analysis result of FIG. 1) are present between high-aspect-ratio gate patterns (11), and defects, such as cracks, micro-pores, delamination, etc., occur in the silicon oxide film.

There are a variety of factors that affect the substitution of the silicon oxide precursor. For example, factors may include distilled water processing, ozone (O$_3$) processing, heat processing, etc. Thus, there is a need to improve the conversion rate from the silicon oxide precursor to the silicon oxide film, and to develop a method for optimizing distilled-water processing and thermal processing (or annealing).

BRIEF SUMMARY OF THE INVENTION

Various embodiments of the present invention are directed to providing a method for forming a silicon oxide film of a semiconductor device that substantially obviates one or more problems due to limitations and disadvantages of the related art.

An embodiment of the present invention relates to a method for forming a silicon oxide film of a semiconductor device. A hydrolytic reaction between distilled water and the silicon oxide precursor material may be facilitated, and the uniformity and density of the silicon oxide film may be improved in the fabrication process of the semiconductor device.

An embodiment of the present invention relates to a method for forming a silicon oxide film of a semiconductor device by performing surface processing using an amine-based compound before and/or after forming a silicon oxide film, so that uniformity and density of the silicon oxide film may be improved.

An embodiment of the present invention relates to a semiconductor device including a silicon oxide film formed by the above-mentioned methods.

According to an embodiment of the present invention, a method for forming a silicon oxide film of the semiconductor device comprises depositing a silicon oxide precursor over a semiconductor substrate, a surface of the semiconductor substrate including a step coverage region; and forming a silicon oxide film by curing the silicon oxide precursor, wherein the surface of the semiconductor substrate is treated with an amine-based compound.

The surface of the semiconductor substrate is treated by the amine-based compound after formation of the silicon oxide film. The surface of the semiconductor substrate is treated by the amine-based compound before deposition of the silicon oxide precursor compound, or formation of the silicon oxide film.

As described above, the silicon-containing oxide precursor is applied to the semiconductor substrate, and is surface-treated using an amine-based compound as a catalyst. The silicon-containing oxide precursor may be completely transformed into a silicon oxide film at a low temperature of 100° C. or less, so that a silicon oxide film having a uniform surface and high density may be formed.

It is to be understood that both the foregoing general descriptions and the following detailed descriptions of the present invention are exemplary and explanatory and are intended to provide further explanation of the invention as claimed.

DESCRIPTION OF EMBODIMENTS

Figure 1:
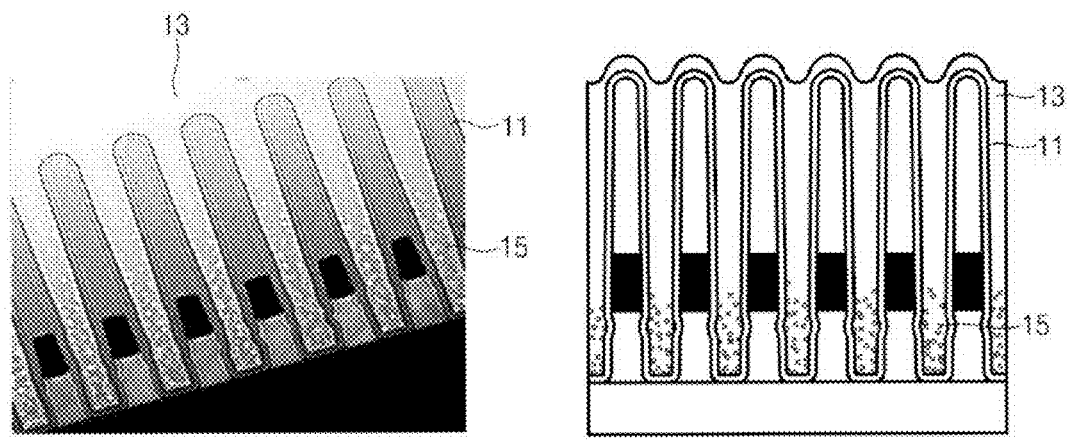
FIG. 1 is an electron microscope image illustrating a cross-sectional view of a silicon oxide film according to the related art.

Exemplary embodiments of the present invention will be described below in more detail with reference to the accompanying figures. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

An embodiment of the present invention relates to a method for forming a silicon oxide film of a semiconductor device.

More specifically, an embodiment of the present invention relates to a method for forming a silicon oxide film of a semiconductor device by performing surface processing using an amine-based compound before and/or after forming a silicon oxide film so that uniformity and density of the silicon oxide film may be improved.

The semiconductor substrate may be treated with the amine-based compound before the deposition of a silicon oxide precursor, after formation of the silicon oxide film, or both. In addition, in an embodiment, the amine-based compound treatment may be performed after the silicon oxide precursor is deposited before the silicon oxide film is formed, after the silicon oxide film is formed, or both before and after the silicon oxide film is formed.

In a method in accordance with an embodiment of the present invention, a silicon oxide precursor is deposited over a semiconductor substrate having recesses, trenches, via holes, or other regions where good step coverage is desired. For example, such a region may also include a space between conductive patterns (21), such as a gate electrode or a metal line pattern (see FIG. 2). A distance between the trenches, the holes, or the conductive patterns may be 0.04-1 μm. In accordance with an embodiment of the present invention, an aspect ratio of such step coverage regions may be in the range of 1:1-10:1.

The silicon oxide precursor may comprise a silicon-containing compound and a solvent. The silicon-containing compound may have a Si—N bond. The silicon-containing compound has weight-average molecular weight of 3000-7000. The silicon-containing compound may be any of a polysilazane compound, and a trisilylamine (TSA) compound, and a polymer thereof. The solvent may be an organic solvent mixed with the silicon-containing compound. In more detail, the solvent may be, but is not limited to, any of dibutyl ether, benzene, toluene, xylene, and diisopropyl ether. The silicon oxide precursor may be applied by a coating or a deposition process under room temperature conditions.

Figure 2:
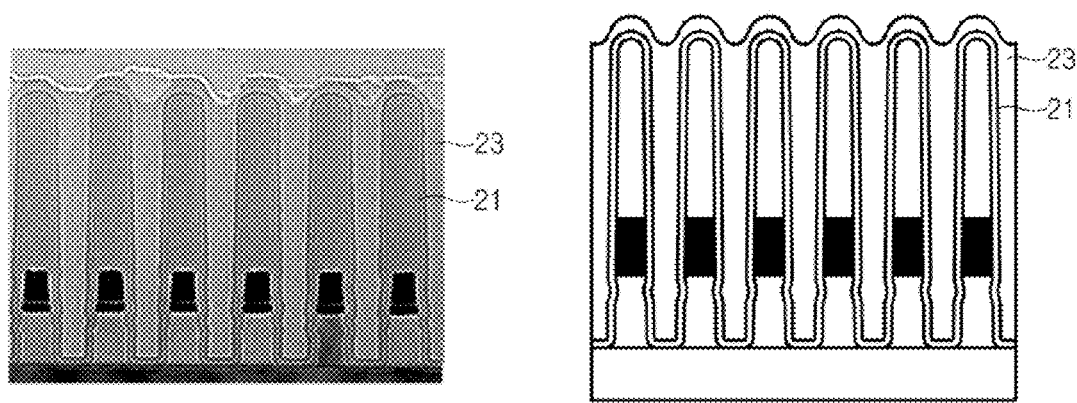
FIG. 2 is an electron microscope image illustrating a cross-sectional view of a silicon oxide film according to an exemplary embodiment of the present invention.

After the silicon oxide precursor is deposited, a curing process is performed to form an oxide film (23) (see FIG. 2). The curing process may be carried out by any of a steam annealing process, a thermal annealing process, an inductively coupled plasma annealing process, an ultraviolet (UV) annealing process, an e-beam annealing process, an acid-vapor catalytic decomposition annealing process, a base-vapor catalytic decomposition annealing process, and a microwave annealing process. The curing process may be carried out at a temperature of 200-500° C. in an $O_2$ or $O_3$ gas atmosphere. If the curing temperature is 200° C. or less, the rate of conversion from the silicon oxide precursor to the silicon oxide film may be poor or the conversion may only occur in some parts of the silicon oxide precursor. For example, if the curing temperature is 500° C. or higher, conversion may only occur in an upper part of the silicon oxide film. An oxide film having a thickness of 1-10 k Å may be formed after completion of the curing process.

In an embodiment, after the curing process has been performed on the silicon oxide precursor, the resulting structure may be treated with an amine-based compound. In an embodiment, the amine-based compound treatment may be performed before the curing process is performed. In addition, in another embodiment, the amine-based compound treatment may be performed before formation of the silicon oxide film (i.e., before the curing process) and after formation of the silicon oxide film (i.e., after the curing process).

The amine-based compound may be a catalyst for accelerating a hydrolytic reaction between the silicon oxide precursor compound and distilled water. The amine-based compound may be represented by the following formula 1:

$R_1R_2-NR_3$            [Formula 1]

In formula 1, each of $R_1$, $R_2$ and $R_3$ may be any of a hydrogen (H), a halogen, an OH group, a $C_1$-$C_5$ alkyl group, a $C_1$-$C_5$ alkoxyl group and a $C_1$-$C_5$ hydroxy alkyl group. The compound of formula 1 may be a hydroxyl alkyl amine or a hydroxylamine. In an embodiment, the amine-based compound may be an aqueous solution having a concentration of 10~80 by weight percentage (%).

The amine-based compound treatment may be performed by dipping a semiconductor substrate, including the silicon oxide precursor (or the silicon oxide film), in an amine-based compound solution, or by applying or depositing the amine-based compound solution over the surface of the semiconductor substrate.

In an embodiment of the present invention, an amine-based compound treatment process may include dipping the semiconductor substrate in an amine-based compound solution under a condition of 10-100° C. for 1 to 360 minutes. In another embodiment of the present invention, an amine-based compound treatment process may include spraying or spin-applying the amine-based compound solution over the surface of the semiconductor substrate.

The amine-based compound may be deposited at a temperature of 110-200° C. under a $N_2$ and Ar atmosphere via chemical vapor deposition (CVD).

When an amine-based compound (for example, hydroxylamine) is used to treat the substrate, the surrounding $H_2O$ molecules may be held or attracted by the amine-based compound. As $H_2O$ is ionized into $H^+$ and $OH^-$ as shown in the following reaction 3, the amine-based compound may serve as a catalyst to improve a reaction between the silicon oxide precursor material and the distilled water.

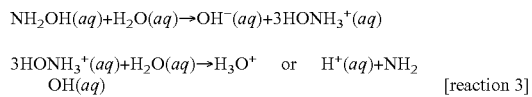

$NH_2OH(aq)+H_2O(aq) \rightarrow OH^-(aq)+3HONH_3^+(aq)$ $3HONH_3^+(aq)+H_2O(aq) \rightarrow H_3O^+$ or $H^+(aq)+NH_2OH(aq)$      [reaction 3]

That is, in an embodiment, the semiconductor substrate including a silicon oxide precursor surface-processed with the amine-based compound, may be annealed at a low temperature of 100° C. or less. For example, the annealing process may be performed at a low temperature of 20-100° C. As a result, the silicon oxide precursor, which in the conventional thermal process is not completely converted, may be completely converted, i.e., 100%-converted, into the silicon oxide film. This may be ascribed to the catalytic reaction of the amine-based compound. As a result, the silicon oxide film may be formed evenly, not only in a peripheral region, but also in the cell region having gate patterns with a high-aspect-ratio.

In addition, the method for forming the silicon oxide film of the semiconductor device may further include performing a planarization process and a cleaning process after curing the silicon oxide film. The planarization process may include a chemical mechanical polishing (CMP) process. In accordance with an aspect of the present invention, the silicon oxide film may be used as an interlayer insulation film.

Various embodiments of the present invention have been described above. Illustrative examples of three embodiments are described below.

Embodiment 1

After a device isolation film/gate is formed on a semiconductor substrate, the substrate is dipped in a hydroxylamine aqueous solution having a concentration of 80% by weight percentage. The substrate is immersed in the hydroxylamine aqueous solution at a temperature of 40° C. for 3600 seconds. The substrate covered with the hydroxylamine solution is spin-dried at 1500 rpm. Subsequently, trisilylamine (TSA), which serves as a flowable oxide (FO) precursor, is deposited over the surface of the substrate covered with spin-dried hydroxylamine. A heat treatment (or annealing) is performed at a temperature of 500° C. or higher and in an $O_2$ or $O_3$ gas atmosphere, so that a silicon oxide film having a thickness of about 1-10K Å may be formed. Then, the silicon oxide film is annealed at a temperature of 100° C. so that a dense silicon oxide film may be formed.

Embodiment 2

After a device isolation film/gate is formed on a semiconductor substrate, trisilylamine (TSA), which serves as a flowable oxide (FO) precursor, is deposited over the semiconductor substrates. Then, heat treatment (or annealing) is performed at a temperature of 500° C. or higher and in an $O_2$ or $O_3$ gas atmosphere, so that a silicon oxide film having a thickness of about 10KÅ may be formed. Subsequently, the substrate is immersed in an aqueous hydroxylamine solution with a concentration of 80% by weight percentage at a temperature of 40° C. for 3600 seconds. The substrate is then annealed at a temperature of 90° C. so that a dense silicon oxide film may be formed.

Embodiment 3

After a device isolation film/gate is formed on a semiconductor substrate, the substrate is dipped in an aqueous hydroxylamine solution with a concentration of 80% by weight percentage at a temperature of 40° C. for 60 seconds. The substrate is then spin-dried at 1500 rpm. Subsequently, after trisilylamine (TSA), which serves as a flowable oxide (FO) precursor, is deposited over the substrate, heat treatment (or annealing) is performed at a temperature of 100° C. and in an $O_2$ or $O_3$ gas atmosphere for 20 minutes, so that a silicon oxide film having a thickness of about 10KÅ may be formed.

Comparative Example of a Method According to the Related Art

After a device isolation film/gate is formed on a semiconductor substrate, trisilylamine (TSA), which serves as a flowable oxide (FO) precursor, is deposited over the structure. Heat treatment (or annealing) is then performed at a temperature of 500° C. and in an $O_2$ or $O_3$ gas atmosphere, so that a silicon oxide film having a thickness of about 10K Å may be formed.

Exemplary Experiment 1

In a first experiment 1 performed in accordance with an embodiment of the present invention, a conversion rate of the silicon oxide precursor to the silicon oxide film in the aforementioned embodiment 2 was compared with that of the aforementioned comparative example through FT-IR (Fourier Transform infrared Spectroscopy) on a flat plate. In addition, individual cross-sections of the silicon oxide films formed in the above-mentioned embodiment and comparison example were investigated via electron microscopy.

Figure 3:
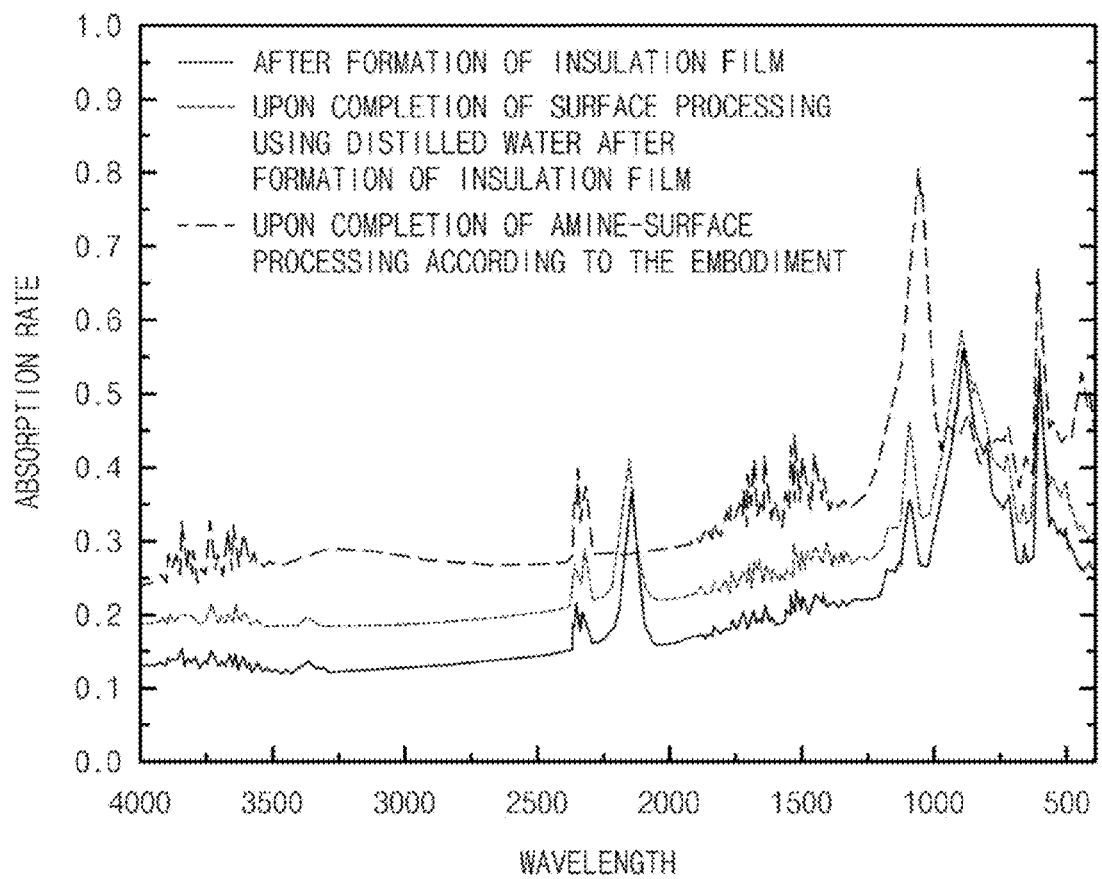
FIG. 3 is a Fourier Transform Infrared Spectroscopy (FT-IR) spectrum illustrating absorption rates measured in experimental examples according to an exemplary embodiment of the present invention.

As shown in FIG. 3, the FT-IR spectrum for the silicon oxide film formed in the aforementioned comparative example shows a variety of peak values, i.e., 3371 cm$^{-1}$ (N—H bond), 2147 cm$^{-1}$ (Si—H bond), and 900 cm$^{-1}$ (Si—N bond). The FT-IR spectrum for the silicon oxide film formed in aforementioned embodiment 2 according to the present invention shows an increased peak value of 1037 cm$^{-1}$ (Si—O—Si bond). Thus, as shown in FIG. 3, the conversion rate of the oxide precursor was improved when the silicon oxide film was form in accordance with an embodiment of the present invention.

Referring to the silicon oxide film formed in the comparative example, conversion from the silicon oxide precursor to the silicon oxide film (13) may not be sufficiently achieved in a high-temperature annealing process. Therefore the unsubstituted nitrogen (N) particles (15) (i.e., white particles in the EELS analysis result) are present between high-aspect-ratio gate patterns (11) (See FIG. 1). In contrast, the silicon oxide film (23) formed by methods of the present invention does not include the unsubstituted N particles between high-aspect-ratio gate patterns (21) (See FIG. 2). Therefore an evenly-filled silicon oxide film may be formed according to an embodiment of the present invention.

As is apparent from the above description, the silicon oxide film surface is treated using an amine-based compound, and a conversion rate from an oxide precursor to an oxide film may be increased at a low temperature, so that defects, such as crack, micro-pore, distribution, and delamination, may be prevented in a process for forming a silicon oxide film.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method for forming a silicon oxide film of a semiconductor device comprising:
    treating a surface of a semiconductor substrate including a step coverage region with an aqueous amine solution;
    depositing a silicon oxide precursor over the treated semiconductor substrate under a room temperature condition; and
    forming a silicon oxide film by curing the silicon oxide precursor,
    wherein the aqueous amine solution includes an amine-based compound of 10-80% by weight percentage (%).

2. The method according to claim 1, wherein the step coverage region includes any of a trench, a contact hole, and two or more conductive patterns.

3. The method according to claim 1, wherein the silicon oxide precursor compound comprises a silicon-containing compound and a solvent.

4. The method according to claim 3, wherein the silicon-containing compound has a weight-average molecular weight of 3000-7000, the silicon-containing compound being any of a polysilazane compound, and a trisilylamine compound.

5. The method according to claim 3, wherein the solvent is any of dibutyl ether, benzene, toluene, xylene, and diisopropyl ether.

6. The method according to claim 1, wherein the curing process is carried out by any of a steam annealing, a thermal annealing, an inductively coupled plasma annealing, an ultraviolet annealing, an e-beam annealing, an acid-vapor catalytic decomposition annealing, a base-vapor catalytic decomposition annealing, and a microwave annealing.

7. The method according to claim 1, wherein the curing process is carried out at a temperature of 200-500° C. in an $O_2$ or $O_3$ gas atmosphere.

8. The method according to claim 1, wherein the amine-based compound is represented by the following formula 1:

$$R_1R_2\text{—}NR_3 \qquad \text{[Formula 1]}$$

wherein each of $R_1$, $R_2$ and $R_3$ is any of a hydrogen (H), a halogen, an OH group, a $C_1$-$C_5$ alkyl group, a $C_1$-$C_5$ alkoxyl group, and a $C_1$-$C_5$ hydroxy alkyl group.

9. The method according to claim 8, wherein the compound of the formula comprises any of a hydroxyl alkyl amine and a hydroxyl amine.

10. The method according to claim 1, wherein the semiconductor substrate is treated by the amine-based compound by any of a dipping process, an application process, and a deposition process.

11. The method according to claim 1, further comprising:
    annealing the surface of the semiconductor substrate including the silicon oxide film.

12. The method according to claim 11, wherein the annealing process is carried out at a temperature of 100° C. or less.

13. The method according to claim 11, further comprising:
    performing a planarization process and a cleaning process on the silicon oxide film after annealing the surface of the semiconductor substrate including the silicon oxide film.

14. The method according to claim 1, wherein the treating step is performed while the aqueous amine solution is a liquid.

* * * * *